(12) United States Patent
Riaziat et al.

(10) Patent No.: US 10,658,998 B2
(45) Date of Patent: May 19, 2020

(54) PIEZOELECTRIC FILM TRANSFER FOR ACOUSTIC RESONATORS AND FILTERS

(71) Applicants: Majid Riaziat, San Jose, CA (US); Yu-Min Houng, Cupertino, CA (US)

(72) Inventors: Majid Riaziat, San Jose, CA (US); Yu-Min Houng, Cupertino, CA (US)

(73) Assignee: OEPIC SEMICONDUCTORS, INC., Sunnyvale, CA (US)

( * ) Notice: Subject to any disclaimer, the term of this patent is extended or adjusted under 35 U.S.C. 154(b) by 395 days.

(21) Appl. No.: 14/445,967

(22) Filed: Jul. 29, 2014

(65) Prior Publication Data

US 2015/0033520 A1    Feb. 5, 2015

Related U.S. Application Data

(60) Provisional application No. 61/860,667, filed on Jul. 31, 2013.

(51) Int. Cl.
*H03H 3/02* (2006.01)
*H01L 41/313* (2013.01)

(52) U.S. Cl.
CPC ............ *H03H 3/02* (2013.01); *H01L 41/313* (2013.01); *H03H 2003/021* (2013.01); *H03H 2003/025* (2013.01); *Y10T 29/42* (2015.01)

(58) Field of Classification Search
CPC ........ H03H 3/02; H01L 41/31; H01L 41/311; H01L 41/313; H01L 41/39; H03K 2003/025
See application file for complete search history.

(56) References Cited

U.S. PATENT DOCUMENTS

| | | |
|---|---|---|
| 4,642,508 A | 2/1987 | Suzuki et al. |
| 5,373,268 A | 12/1994 | Dworsky et al. |
| 5,641,381 A | 6/1997 | Bailey et al. |
| 5,873,154 A | 2/1999 | Ylilammi et al. |
| 6,033,995 A | 3/2000 | Muller |
| 6,060,818 A | 5/2000 | Ruby et al. |
| 6,455,340 B1 | 9/2002 | Chua et al. |
| 6,515,558 B1 | 2/2003 | Ylilammi |
| 6,542,054 B2 | 4/2003 | Aigner et al. |
| 6,603,241 B1 | 8/2003 | Barber et al. |
| 6,617,751 B2 | 9/2003 | Sunwoo et al. |
| 6,841,922 B2 | 1/2005 | Aigner et al. |
| 7,173,361 B2 | 2/2007 | Saito et al. |
| 7,332,985 B2 | 2/2008 | Larson, III et al. |
| 7,414,350 B1 | 8/2008 | Barber et al. |
| 7,619,493 B2 | 11/2009 | Uno et al. |
| 7,669,310 B2 | 3/2010 | Fattinger |
| 8,110,425 B2 | 2/2012 | Yun |
| 8,378,385 B2 | 2/2013 | Forrest et al. |
| 2002/0093398 A1 | 7/2002 | Ella et al. |
| 2002/0121405 A1 | 9/2002 | Ruby et al. |
| 2003/0088960 A1 | 5/2003 | Seo et al. |
| 2003/0193269 A1 | 10/2003 | Jang et al. |
| 2004/0207490 A1 | 10/2004 | Jun et al. |
| 2005/0179508 A1 | 8/2005 | Sato |

(Continued)

*Primary Examiner* — Livius R. Cazan
(74) *Attorney, Agent, or Firm* — Weiss & Moy, P.C.; Jeffrey D. Moy

(57) ABSTRACT

A method for forming an acoustic resonator comprising: forming a piezoelectric material on a first substrate; and applying the piezoelectric material to a second substrate on which the acoustic resonator is fabricated upon.

12 Claims, 5 Drawing Sheets

(56) References Cited

U.S. PATENT DOCUMENTS

| | | |
|---|---|---|
| 2005/0253670 A1 | 11/2005 | Song et al. |
| 2006/0145785 A1* | 7/2006 | Ishii ................ H03H 3/02 |
| | | 333/187 |
| 2006/0214745 A1 | 9/2006 | Park et al. |
| 2010/0143748 A1* | 6/2010 | Tanizaki ............ C30B 25/02 |
| | | 428/698 |

* cited by examiner

| Epitaxial Material | SMR | FBAR |
|---|---|---|
|  (a) |  (c) ← 42 |  (c) ← 52 |
|  (b) 40 → |  (d) ← 44 |  (d) ← 54 |
| |  (e) ← 46 |  (e) ← 56 |
| |  (f) |  (f) |
| Figure 5 | Figure 6 | Figure 7 |

PIEZOELECTRIC FILM TRANSFER FOR ACOUSTIC RESONATORS AND FILTERS

RELATED APPLICATIONS

This patent application is related to U.S. Provisional Application No. 61/860,667, filed Jul. 31, 2013, entitled "PIEZOELECTRIC FILM TRANSFER FOR ACOUSTIC RESONATORS AND FILTERS" in the name of the same inventors stated above, and which is incorporated herein by reference in its entirety. The present patent application claims the benefit under 35 U.S.C § 119(e).

TECHNICAL FIELD

The present application relates generally to electronic devices, and more specifically, to a method for the fabrication of acoustic resonators on single crystal epitaxial aluminum nitride piezoelectric films using a novel epitaxial transfer method.

BACKGROUND

As portable electronic devices, such as cellular phones, computer tablets, and the like, become more prevalent, demand for compact, lightweight filters used in these electronic devices may also be rising. In many electronic devices, electrical resonators may be used as filters. For example, in many wireless communications devices, radio frequency (rf) and microwave frequency resonators may be used as filters to improve reception and transmission of signals. Filters typically include inductors and capacitors, and more recently resonators.

Film bulk acoustic resonators (FBARs) may be used as compact, lightweight filters in these electronic devices. FBARs may be inexpensively mass-produced and may be implemented in a micro-structure. A FBAR may have a multi-layer resonance section in which a bottom electrode, a piezoelectric layer, and a top electrode are sequentially provided in this order. The FBAR may use a piezoelectric phenomenon, by which when electric energy is applied to the top and bottom electrodes, piezoelectric effect may be produced and resonance results. In such a FBAR, separation between the substrate and the multi-layer resonance section may be needed, so that acoustic waves generated from the piezoelectric layer are not affected by the substrate.

Recent advanced fabrication modalities have led to face-mounted resonators, which are commonly known as solidly-mounted resonator (SMR). Acoustic stack plates in SMRs have been used only for their mechanical properties as impedance transformers, but stacks with a piezoelectric layer provide an additional degree of freedom, because the electrical boundary condition on the piezoelectric layer may be altered.

Currently, aluminum nitride (AlN) films that may be used for acoustic resonators are polycrystalline piezoelectric films deposited by reactive sputtering over a limited selection of metals and dielectrics that are suitable for the growth of reasonable quality films. For example, Film Bulk Acoustic Resonators (FBARs) are generally fabricated by sputtering the piezoelectric film over a semiconductor wafer. Solid Mounted Resonators (SMRs) may be fabricated by sputtering the piezoelectric film over a wafer with Distributed Bragg Reflectors (DBR). Sputtered piezoelectric films are polycrystalline and their quality, uniformity and reproducibility depend on growth conditions, substrate conditions, and layer thickness. Thus, it may be difficult to form resonators having high quality, uniformity and reproducibility.

Therefore, it would be desirable to provide a device and method that overcomes all of the above.

SUMMARY

This summary is provided to introduce a selection of concepts in a simplified form that are further described below in the DESCRIPTION OF THE APPLICATION. This summary is not intended to identify key features of the claimed subject matter, nor is it intended to be used as an aid in determining the scope of the claimed subject matter In accordance with one embodiment, a method for forming an acoustic resonator is disclosed. The method comprises: forming a piezoelectric material on a first substrate; and applying the piezoelectric material to a second substrate on which the acoustic resonator is fabricated upon.

In accordance with another embodiment, a method for forming an acoustic resonator is disclosed. The method comprises: forming a piezoelectric material on a first substrate; forming metal electrodes on the piezoelectric material; and applying the piezoelectric material having the electrodes to a second substrate on which the acoustic resonator is fabricated upon, the first substrate being of a different material than the second substrate In accordance with another embodiment, a method for forming an acoustic resonator is disclosed. The method comprises: forming a piezoelectric structure on a first substrate; and applying the piezoelectric structure to a second substrate on which the acoustic resonator is fabricated upon, the first substrate being of a different material than the second substrate

BRIEF DESCRIPTION OF DRAWINGS

The novel features believed to be characteristic of the application are set forth in the appended claims. In the descriptions that follow, like parts are marked throughout the specification and drawings with the same numerals, respectively. The drawing figures are not necessarily drawn to scale and certain figures can be shown in exaggerated or generalized form in the interest of clarity and conciseness. The application itself, however, as well as a preferred mode of use, further objectives and advantages thereof, will be best understood by reference to the following detailed description of illustrative embodiments when read in conjunction with the accompanying drawings, wherein:

DESCRIPTION OF THE APPLICATION

The description set forth below in connection with the appended drawings is intended as a description of presently preferred embodiments of the application and is not intended to represent the only forms in which the present application can be constructed and/or utilized. The description sets forth the functions and the sequence of steps for constructing and operating the application in connection with the illustrated embodiments. It is to be understood, however, that the same or equivalent functions and sequences can be accomplished by different embodiments that are also intended to be encompassed within the spirit and scope of this application.

The below description is written for bulk acoustic resonator (BAR) devices. More specifically, the below description is written for BAR devices fabricated with aluminum nitride as the piezoelectric material. However, the applicability of the invention is broader and may be used with other piezoelectric materials such as zinc oxide (ZnO) and Lead zirconium titanate (PZT), and with both bulk and surface resonance modes.

This below description describes the fabrication of advanced bulk acoustic resonators on single crystal epitaxial aluminum nitride piezoelectric films using a novel epitaxial transfer method. The resulting high performance bulk acoustic resonator devices may be used in application such as, but limited to, wireless communication applications and advanced high-frequency filters. The transferred single crystal films may yield resonators that have much higher quality, uniformity and reproducibility compared with current resonators fabricated by depositing in-situ polycrystalline aluminum nitride films. The quality of the transferred piezoelectric films described in the current application may not be affected by the selection of the underlying materials and has no thickness dependence. This gives significant device design and frequency selection flexibilities and allows the fabrication of higher performance resonators and filters.

Communication wavelength bands used by mobile phones may be separated by guard bands in order to minimize interference. Guard bands waste available spectrum and need to be minimized. This in turn places stringent requirements on filters and duplexers to have low loss passbands with very sharp rejection edges. Early solutions were ceramic and Surface Acoustic Wave (SAW) filters. More recently, Bulk Acoustic Resonator (BAR) filters have been adopted for this application due to their reduced size, higher performance and higher temperature stability.

The piezoelectric material that physically forms the resonant structure in acoustic resonators may typically be made of aluminum nitride (AlN). Currently, AlN films that may be used for acoustic resonators are polycrystalline piezoelectric films deposited by reactive sputtering over a limited selection of metals and dielectrics that are suitable for the growth of reasonable quality films. The resulting material is polycrystalline but needs to be oriented with its z crystal axis perpendicular to the surface of the wafer. Crystal misorientation, antiphase and amorphous domains degrade the quality of the film. Films with good enough quality can be deposited on specific materials such as Si, $SiO_2$, Mo, Pt, and Ir, but the choice is limited. Also, thinner films needed for higher frequency resonators suffer from lower quality. The quality of the film may also be affected by the physical structure and the processing done on the underlying material. The approach described below removes most such material restrictions while offering a high quality and reproducible single crystal film for acoustic resonators. This may free the designers from material restrictions and opens the door to novel and more advanced designs for existing and higher frequency devices.

The present application modifies the deposition procedure, and instead uses the best quality single crystal epitaxial AlN material. This material is typically grown on a sapphire substrate, and it is widely available for optoelectronic applications. The present application may use an epitaxial transfer technology to bond the AlN film onto silicon, GaAs, or other wafer platforms suitable for RF circuit fabrication. With this approach, the BAR device design gains additional degrees of freedom in terms of device architecture, material choices, and processing techniques e.g., electrode materials and AlN thicknesses most suitable for the application may be selected without concern for any adverse effect on the quality of the piezoelectric film.

Figure 1:
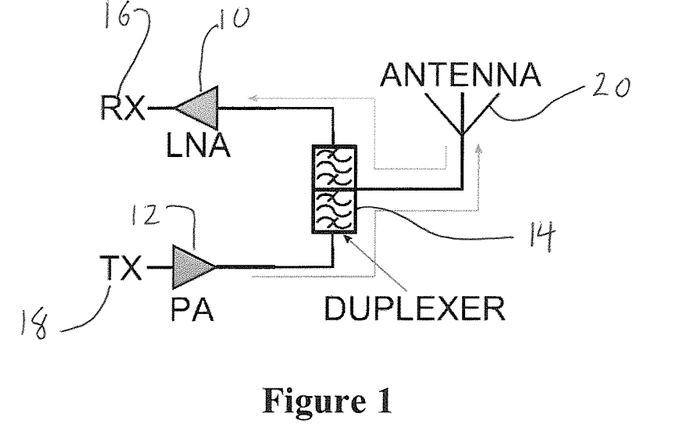
FIG. 1 shows a simplified circuit for a wireless transceiver, wherein a duplexer may be used so signals from the antenna may be directed to the LNA, and signals from the PA may be directed to the antenna without interference.

Referring to FIG. 1, when receiving, a mobile phone may have to be able to pick up a weak signal from a base station at the presence of noise and interfering signals. A low noise amplifier (LNA) 10 may be used to boost the signal to usable levels. On the transmission side, the mobile phone may have to output a signal of significant power in order to reach the base station. This signal may be produced by the power amplifier (PA) 12. The LNA 10 is designed to work with very weak signals and it is critical to block interfering unwanted signals from entering it. On the other hand, the PA 12 is designed to blast out a powerful radio signal, and care must be taken to limit the signal to the allocated frequency range. Both of these functions are performed by the duplexer 14. The duplexer 14 may allow bi-directional communication over a single path. The duplexer 14 may isolates the receiver RX 16 from the transmitter TX 18 while permitting them to share a common antenna 20.

Figure 2A:
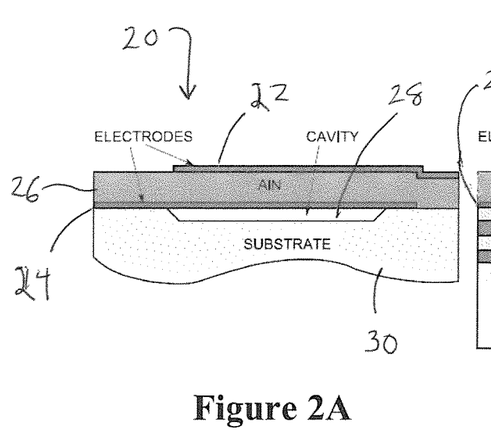
FIG. 2A shows a simplified cross-sectional view of a Film Bulk Acoustic Resonator (FBAR) using an airgap as the bottom mirror.
Figure 2B:
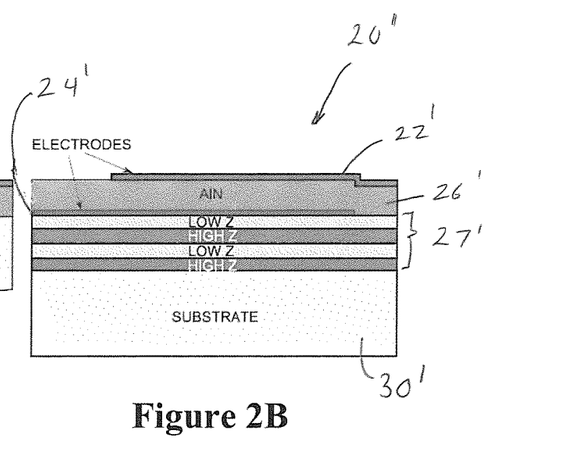
FIG. 2B shows a simplified cross-sectional view of a Solidly Mounted Resonator (SMR) a multilayer Bragg reflector as the bottom mirror.

Referring to FIGS. 2A-2B, basic structures of a bulk acoustic resonator may be seen. As may be seen in FIG. 2A, the Film Bulk Acoustic Resonator (FBAR) 20 may be comprised of a pair of electrodes 22 and 24 and a piezoelectric film 26 between the electrodes 22 and 24. The piezoelectric film 26 and electrodes 22 and 24 may be suspended over a cavity 28 defined in a substrate 30. This way of suspending the FBAR 20 allows the FBAR 20 to resonate mechanically in response to an electrical signal applied between the electrodes 22 and 24.

As may be seen in FIG. 2B, the Film Bulk Acoustic Resonator (FBAR) 20' may be comprised of a pair of electrodes 22' and 24' and a piezoelectric film 26' between the electrodes 12' and 14'. A multilayer Bragg reflector 27' is positioned between the piezoelectric film 26', electrodes 22' and 24' and the substrate 30'.

In the BARs 12 and 12", the resonance frequency condition for the parallel plate resonance is:

$$f = \frac{nV}{2t}$$

where V is the velocity of the acoustic mode, n is an integer (mode number), and t is the thickness of the crystal. Odd values of ti couple to the external circuit.

Figure 3:
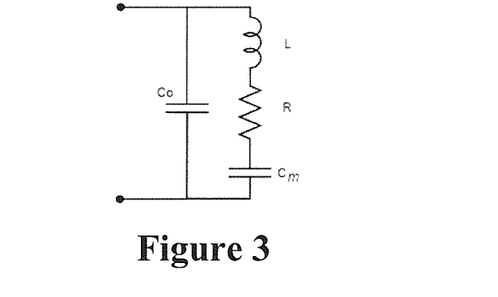
FIG. 3 equivalent circuit model of a bulk acoustic resonator (BAR) known as a Butterworth-Van-Dyke or the BVD model.

The simplest equivalent circuit model of a BAR may be a Butterworth-Van-Dyke or the BVD model and is shown in FIG. 3. In this model, the series resonance elements L, R, and $C_m$ represent the acoustic resonance and the capacitance $C_O$ is the external parallel plate capacitance of the BAR device.

One of the fundamental parameters of the BAR device may be the value of $k_{eff}^2$ known as the electromechanical coupling coefficient. The $k_{eff}^2$ value is the ratio of the electrical energy to the stored mechanical energy in the resonator, and it may measure the efficiency of the piezoelectric device in converting electrical energy to mechanical energy and vice versa. The coupling coefficient may be affected by the quality of the piezoelectric film and it related to other parameters of the BAR device.

$$k_{eff}^2 \sim \frac{C_m}{C_0 + C_m} = \frac{f_p^2 - f_s^2}{f_p^2},$$

In the above equation, fp and fs may be the parallel and series resonances or the antiresonance and resonance frequencies of the BAR device. State of the art BAR devices may have coupling coefficients of ~6% or higher at 2.0 GHz. The value of the coupling coefficient may determine the filter passband that can be achieved. The AlN material used for the piezoelectric element 16 and 16" needs to have a strong c-axis alignment with a narrow rocking curve peak (FWHM≤3°) in order to achieve a high enough coupling coefficients.

Figure 4:
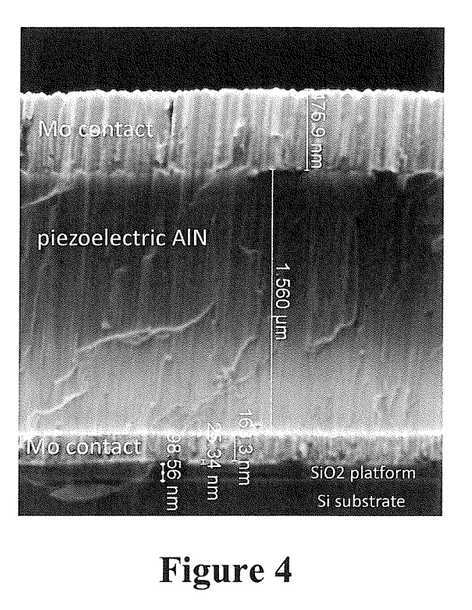
FIG. 4 cross sectional view of an AlN film grown for BAR device fabrication, the AlN film sandwiched between two layers of molybdenum.

In the prior art, the piezoelectric AlN is typically deposited by reactive sputtering of a pure Al target using a combination of Nitrogen and Argon as the sputtering gasses. The insulating nature of the film makes it difficult to sputter because of the "disappearing anode" effect. Other complications may arise from the need for stress control in the film, and the film's sensitivity to the nature and quality of the underlying material. Film stress calibration may need to be done for any desired AlN thickness. Material growth is typically done in a dedicated system with dual AC target technology, and substrate bias to prep surfaces. FIG. 4 shows the Scanning Electron Microscope (SEM) cross section of an aluminum nitride layer grown for device fabrication. The film is sandwiched between two layers of molybdenum that form the electrodes of the resonator.

In order to overcome the above issues, an approach will be disclosed that decouples the growth of high quality AlN films from the materials and processes used in the fabrication of BAR devices. Single crystal, high quality aluminum nitride may be epitaxially grown on sapphire. This structure may then be transferred to a semiconductor wafer for BAR processing as disclosed below.

Figure 5:
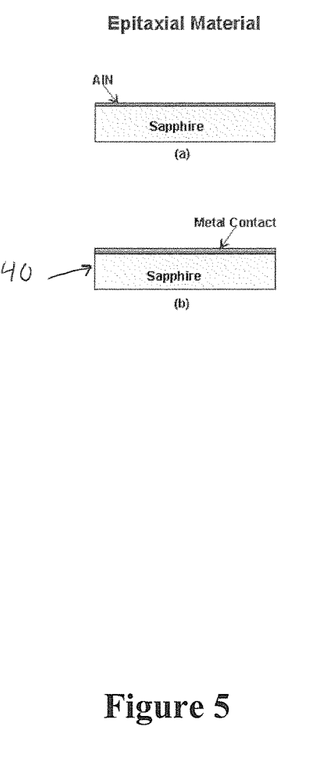
FIG. 5 shows a process for growing a piezoelectric material on a first substrate to be used in a method for BAR device fabrication.
Figure 8:
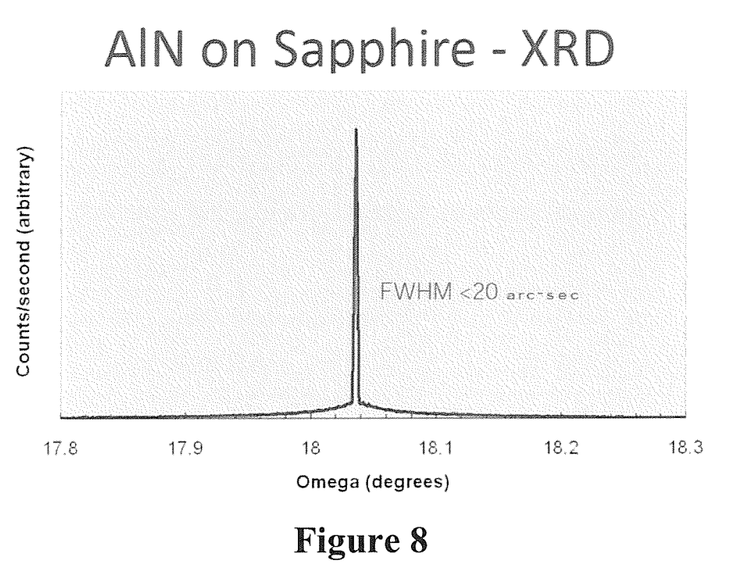
FIG. 8 shows an X-Ray Diffraction (XRD) rocking curve for epitaxial AlN film wherein the Full Width at Half Maximum (FWHM) is <20 arc-sec compared with 1.0 to 2.0 degrees routinely obtained with sputtered films.

Referring to FIG. 5, as shown in Step (a), single crystal, high quality aluminum nitride (AlN) film is epitaxially grown on sapphire. Depending on the required thickness, the epitaxial material may be grown by MOCVD or by HVPE. Kyma Technologies commercially grows AlN films on sapphire substrates by HVPE. Typical XRD rocking curve data for their material may be seen in FIG. 8.

Figure 9:
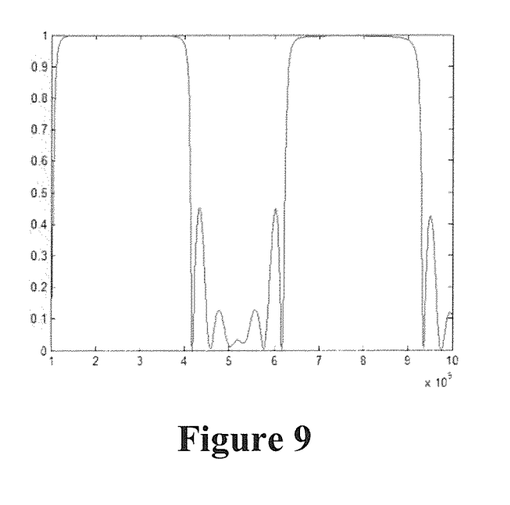
FIG. 9 shows a simulated broad r reflection spectrum from an acoustic mirror stack of W and $SiO_2$.

Next, as shown in Step (b), metal contacts may then be formed on the AlN film epitaxially grown on the sapphire to form structure 40. The metal contacts may be formed by depositing a desired electrode material over the AlN film. The structure 40 formed in Step (b) may then be transferred to a semiconductor wafer for BAR processing Referring to FIG. 6, a description for a Solidly Mounted Resonator (SMR) will be described. As shown in Step (c) of FIG. 6, a semiconductor substrate is prepared with a Bragg reflector to form structure 42. The Bragg reflector may be formed of a plurality of layers. The Bragg reflector may be formed by disposing multiple layers of alternating materials with varying acoustic impedances. As may be seen in FIG. 2, the Bragg reflector may be formed by disposing multiple layers of alternating materials, wherein the layers alternate between high and low acoustic impedances. In accordance with one embodiment, the Bragg reflector may be made of alternating layers of tungsten and $SiO_2$ for good acoustic contrast. The thickness of each layer may be designed to be approximately ¼ of the acoustic mode wavelength at the operation frequency. FIG. 9 shows the simulated reflection from one such mirror stack.

Figure 6:
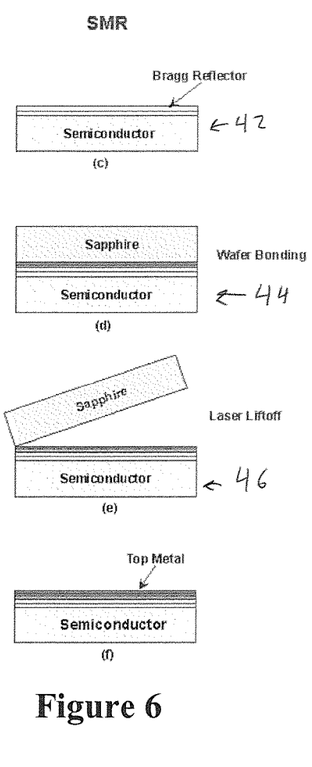
FIG. 6 shows a process for BAR device fabrication using an epitaxial transfer method for SMR fabrication.

In Step (d) of FIG. 6, wafer bonding between structure 40 formed in FIG. 5, Step (b) and structure 42 formed in FIG. 6, Step (c) is preformed to form structure 44. As may be seen in Step (d), structure 40 is applied to structure 42 so that the metal contacts of structure 40 bonds to the Bragg reflector of structure 42. In accordance with one embodiment, in the wafer bonding step shown in FIG. 6, Step (d), the AlN film may receive a partial contact metal deposition prior to wafer bonding. The bonding may be done by temperature and pressure using a bonding agent that may be a metallic eutectic or a dielectric layer. Au—Ge, Pd—In and glass frit are some examples of such bonding agents. The above listing is given as an example and should not be seen in a limiting manner. Other bonding agents may be used without departing from the spirit and scope of the present invention.

Figure 10:
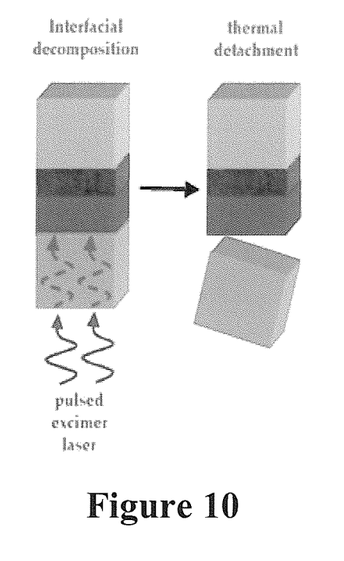
FIG. 10 shows a process for a laser liftoff process by which the sapphire substrate is released from the epitaxial film.

Next, in Step (e) of FIG. 6, the sapphire substrate is removed from the combined structure 44. The sapphire substrate may be removed by laser liftoff to form device 46. Sapphire is transparent to pulsed UV lasers. If the epitaxial layer grown on sapphire absorbs the UV radiation, a local decomposition may be induced that may release the epitaxial film from the sapphire substrate as shown in FIG. 10. Laser liftoff for AlN may be carried out by pulsed excimer lasers such as ArF. In Step (f), of FIG. 6, one continues to process the device 46 on the semiconductor wafer to form the SMR. These steps may include, but are not limited to, material depositions and etching steps to form the SMR.

Figure 7:
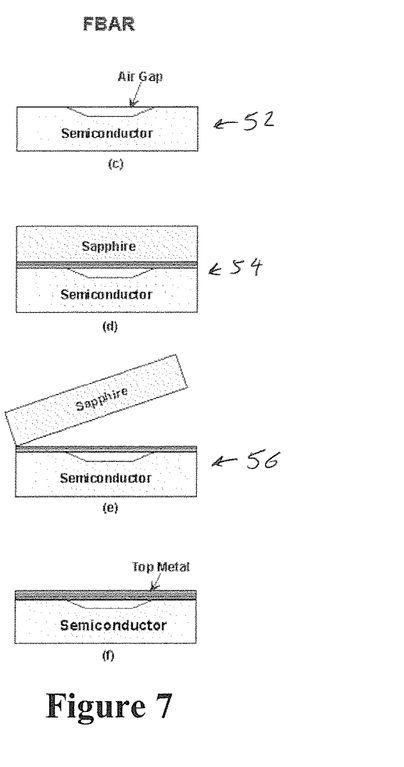
FIG. 7 shows a process for BAR device fabrication using an epitaxial transfer method for FBAR fabrication.

For a Film Bulk Acoustic Resonator (FBAR), the process may be seen in FIG. 7. As shown n Step (c) of FIG. 7, a semiconductor substrate is prepared with a depression formed in the substrate to form structure 52. The depression may be used to server as air gap acoustic mirrors for the FBAR. In Step (d) of FIG. 7, wafer bonding between structure 40 formed in FIG. 5, Step (b) and structure 52 formed in FIG. 7, Step (c) is preformed to form structure 54. As may be seen in Step (d), structure 40 is applied to structure 52 so that the metal contacts of structure 40 bonds to the structure 52 across the gap formed in the substrate. In accordance with one embodiment, in the wafer bonding step shown in FIG. 7, Step (d), the AlN film may receive a partial contact metal deposition prior to wafer bonding. The bonding may be done by temperature and pressure using a bonding agent that may be a metallic eutectic or a dielectric layer. Au—Ge, Pd—In and glass frit are some examples of such bonding agents. The above listing is given as an example and should not be seen in a limiting manner. Other bonding agents may be used without departing from the spirit and scope of the present invention.

Next, in Step (e) of FIG. 7, the sapphire substrate is removed from the combined structure 54. The sapphire substrate may be removed by laser liftoff to form device 56. Sapphire is transparent to pulsed UV lasers. If the epitaxial layer grown on sapphire absorbs the UV radiation, a local decomposition may be induced that may release the epitaxial film from the sapphire substrate as shown in FIG. 10. Laser liftoff for AlN may be carried out by pulsed excimer lasers such as ArF. In Step (f), of FIG. 6, one continues to process the device 56 on the semiconductor wafer to form the SMR. In Step (f), of FIG. 7, one continues to process the device 36 on the semiconductor wafer to form the FBAR. These steps may include, but are not limited to, material depositions and etching steps to form the FBAR.

While embodiments of the disclosure have been described in terms of various specific embodiments, those skilled in the art will recognize that the embodiments of the disclosure may be practiced with modifications within the spirit and scope of the claims.

What is claimed is:

1. A method for forming an acoustic resonator comprising;
   forming a piezoelectric material on a first substrate, wherein forming the piezoelectric material comprises:
      growing a single crystal aluminum nitride film directly on a sapphire substrate; and
      depositing an electrode material on a first surface of the single crystal aluminum nitride film forming a first electrode;
   forming a reflector device on a semiconductor substrate separate from the sapphire substrate;
   bonding the first electrodes to the reflector device formed on the semiconductor substrate so that the first electrode formed on the single crystal aluminum nitride film on the sapphire substrate attaches to the reflector device; and
   removing the sapphire substrate.

2. The method of claim 1, further comprising forming acoustic reflectors on the piezoelectric material on the first substrate.

3. The method of claim 1, wherein the piezoelectric material is grown by epitaxial deposition.

4. The method of claim 1, wherein removing the sapphire substrate further comprises removing the sapphire substrate from the single crystal aluminum nitride film by laser liftoff.

5. The method of claim 1, wherein forming a reflector device further comprises attaching a Braggs reflector to the semiconductor substrate separate from the sapphire substrate before applying the piezoelectric material.

6. The method of claim 1, further comprising:
   forming an indentation in the semiconductor substrate separate from the sapphire substrate; and
   applying the piezoelectric material over the indentation on the semiconductor substrate separate from the sapphire substrate.

7. The method of claim 1, wherein growing the single crystal aluminum nitride film on a sapphire substrate is grown through one of metal organic chemical vapor deposition (MOCVD) or hydride vapor phase epitaxy (HVPE).

8. The method of claim 1, further comprising applying a contact metal deposition to the single crystal aluminum nitride film prior to bonding the metal electrodes on the aluminum nitride film to the reflector device.

9. A method for forming an acoustic resonator comprising:
   forming a single crystal aluminum nitride film directly on a sapphire substrate;
   forming a metal electrode on the single crystal aluminum nitride film;
   forming a reflector device on a second substrate, the second substrate separate and apart from the sapphire substrate;
   bonding the metal electrode on the single crystal aluminum nitride film to the reflector device formed on the second substrate, the second substrate being a different material from the sapphire substrate;
   removing the sapphire substrate from the single crystal aluminum nitride film by laser liftoff.

10. The method of claim 9, wherein forming a single crystal aluminum nitride film is grown by epitaxial deposition.

11. The method of claim 9, wherein the reflector is a Braggs reflector.

12. The method of claim 9, further comprising:
    forming an indentation in the second substrate; and
    forming the single crystal aluminum nitride film over the indentation on the second substrate.

* * * * *